(12) United States Patent
Yu et al.

(10) Patent No.: US 9,634,132 B2
(45) Date of Patent: Apr. 25, 2017

(54) SEMICONDUCTOR STRUCTURES AND METHODS FOR MULTI-LEVEL BAND GAP ENERGY OF NANOWIRE TRANSISTORS TO IMPROVE DRIVE CURRENT

(71) Applicant: Taiwan Semiconductor Manufacturing Company Limited, Hsinchu (TW)

(72) Inventors: Tsung-Hsing Yu, Taipei (TW); Chia-Wen Liu, Taipei (TW); Yeh Hsu, Taoyuan (TW); Jean-Pierre Colinge, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 345 days.

(21) Appl. No.: 14/184,033

(22) Filed: Feb. 19, 2014

(65) Prior Publication Data

US 2015/0236145 A1    Aug. 20, 2015

(51) Int. Cl.
| | | |
|---|---|---|
| *H01L 29/775* | (2006.01) | |
| *H01L 29/66* | (2006.01) | |
| *H01L 29/06* | (2006.01) | |
| *H01L 29/165* | (2006.01) | |

(52) U.S. Cl.
CPC .......... *H01L 29/775* (2013.01); *H01L 29/068* (2013.01); *H01L 29/66439* (2013.01); *H01L 29/0673* (2013.01); *H01L 29/0676* (2013.01); *H01L 29/165* (2013.01)

(58) Field of Classification Search
CPC ............ H01L 29/068; H01L 29/42392; H01L 27/11273; H01L 29/105; H01L 29/1054; H01L 29/66439; H01L 29/775
See application file for complete search history.

(56) References Cited

U.S. PATENT DOCUMENTS

| | | | | |
|---|---|---|---|---|
| 6,744,083 B2* | 6/2004 | Chen | ...................... | B82Y 10/00 257/219 |
| 8,890,119 B2* | 11/2014 | Doyle | ............... | H01L 29/66666 257/24 |

FOREIGN PATENT DOCUMENTS

TW        200610004        3/2006

* cited by examiner

*Primary Examiner* — Jose R Diaz
(74) *Attorney, Agent, or Firm* — Jones Day

(57) ABSTRACT

A semiconductor device is provided having a channel formed from a nanowire with multi-level band gap energy. The semiconductor device comprises a nanowire structure formed between source and drain regions. The nanowire structure has a first band gap energy section joined with a second band gap energy section. The first band gap energy section is coupled to the source region and has a band gap energy level greater than the band gap energy level of the second band gap energy section. The second band gap energy section is coupled to the drain region. The first band gap energy section comprises a first material and the second band gap energy section comprises a second material wherein the first material is different from the second material. The semiconductor device further comprises a gate region around the junction between the first band gap energy section and the second band gap energy section.

17 Claims, 11 Drawing Sheets

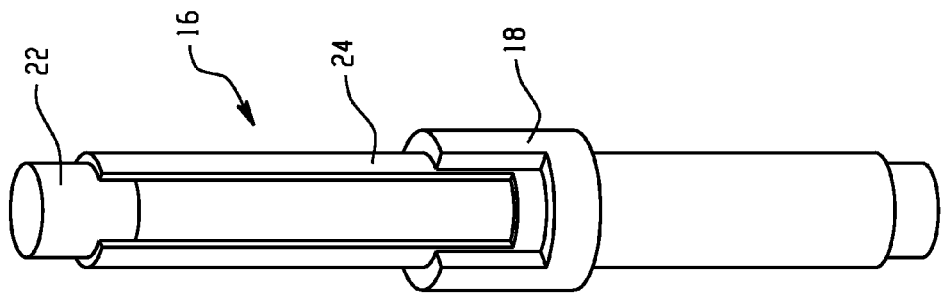
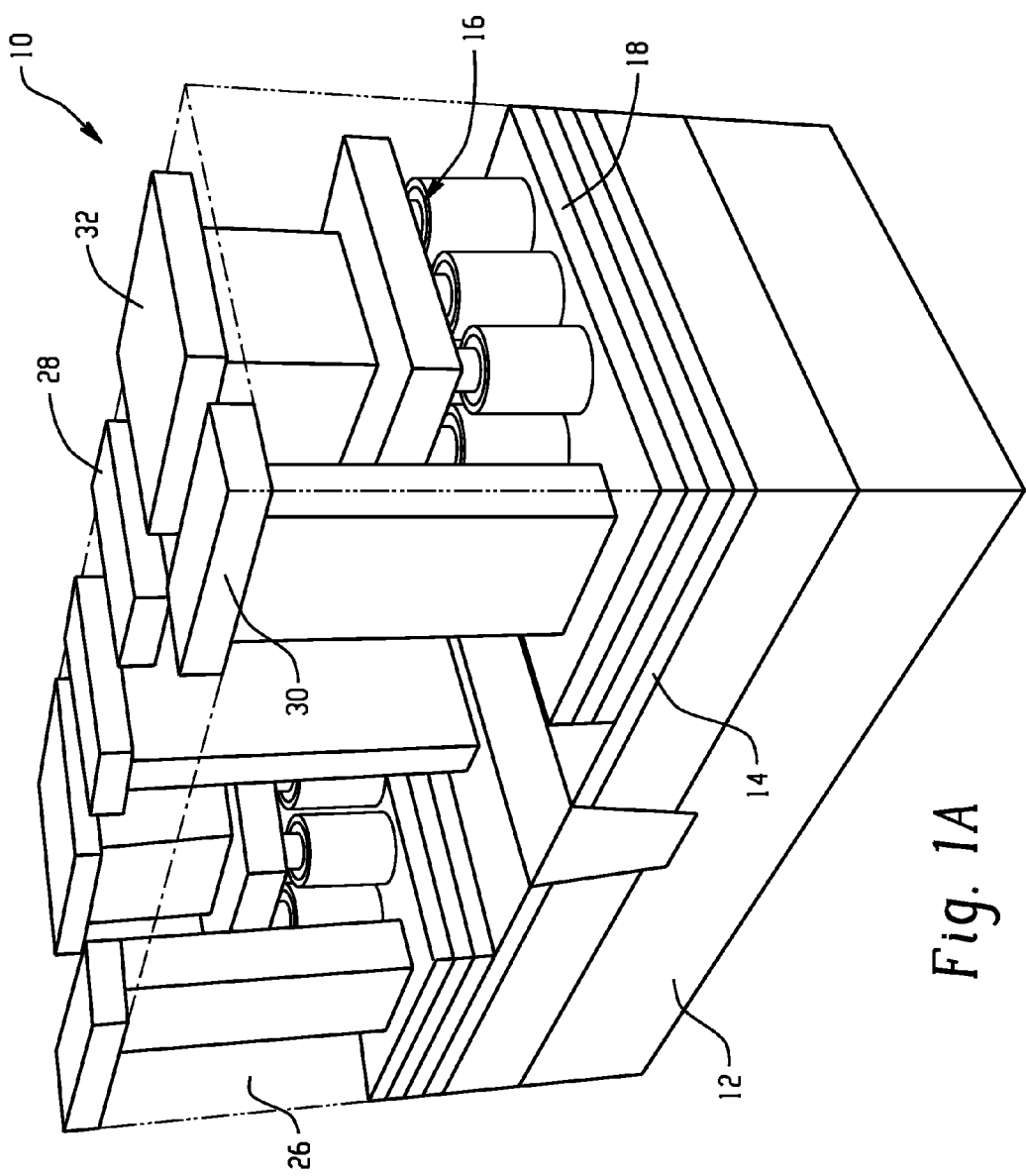

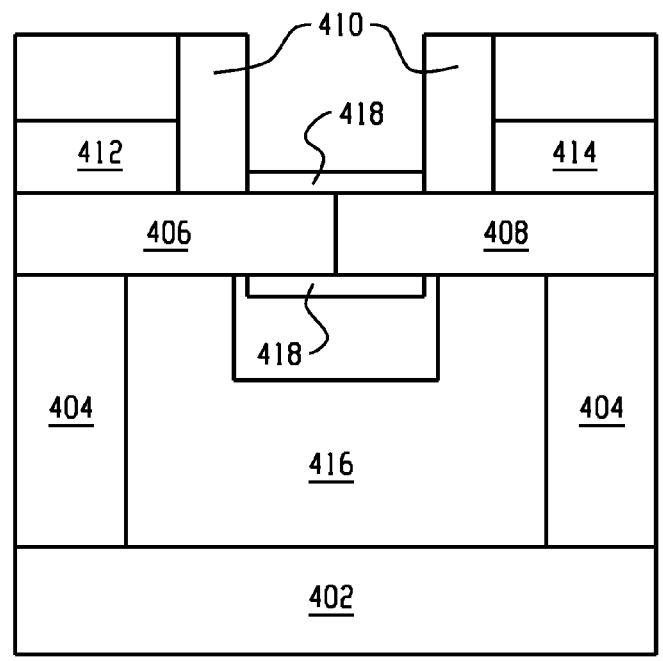
Fig. 15A
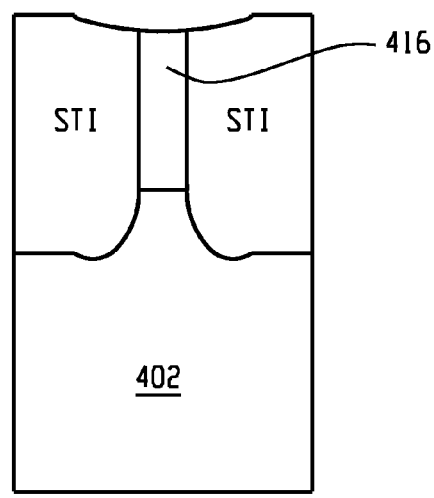
Fig. 15B

SEMICONDUCTOR STRUCTURES AND METHODS FOR MULTI-LEVEL BAND GAP ENERGY OF NANOWIRE TRANSISTORS TO IMPROVE DRIVE CURRENT

BACKGROUND

The technology described in this patent document relates generally to semiconductor devices and more particularly to nanowire semiconductor devices.

Scaling of semiconductor devices, such as a metal-oxide semiconductor field-effect transistor (MOSFET), has enabled continued improvement in speed, performance, density, and cost per unit function of integrated circuits over the past few decades. Development of nanowire devices can further the scaling of integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a block diagram of an example semiconductor device that is formed using nanowire technology, in accordance with some embodiments.

FIG. 1B is a diagram of an example nanowire structure that may be formed in the example semiconductor device of FIG. 1A, in accordance with some embodiments.

FIGS. 14A, 14B, 15A and 15B are drawings depicting example states of a semiconductor structure during fabrication of a semiconductor device structure having a nanowire with multi-level band gap energy, in accordance with some embodiments.

DETAILED DESCRIPTION

Figure 2A:
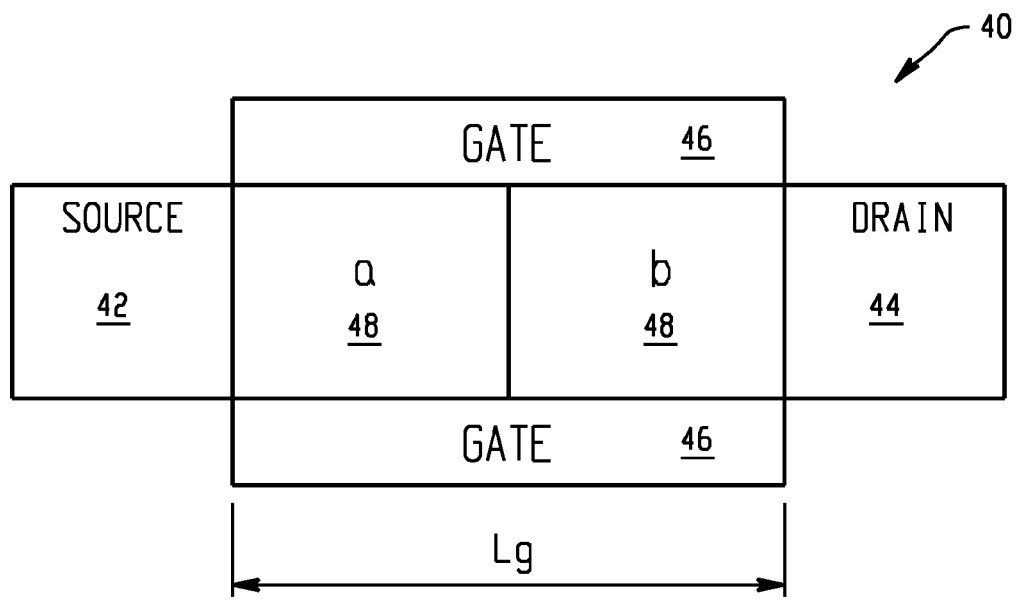
FIG. 2A depicts an example nanowire structure, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a block diagram of an example semiconductor device 10 that is formed using nanowire technology. The device is fabricated on a substrate 12. In this example, the substrate comprises bulk substrate, although other substrate structures such as silicon-on-insulator (SOI) may be used. In some embodiments the bulk substrate can include an elementary semiconductor including silicon or germanium in crystal, polycrystalline, or an amorphous structure; a compound semiconductor including silicon carbide, gallium arsenide, gallium phosphide, indium phosphide, indium arsenide, and indium antimonide; an alloy semiconductor including SiGe, SiGeSn, GeSn, GaAsP, AlInAs, AlGaAs, GaInAs, GaInP, and GaInAsP; any other suitable material; or combinations thereof. In some embodiments the bulk substrate can include p-type material and in other embodiments the bulk substrate can include n-type material. The substrate 12 may include isolation regions, doped regions, and/or other features.

The example semiconductor device 10 further includes a source region 14 in the substrate 12, one or more nanowire structures 16, and gate material 18 above the substrate and surrounding a middle portion of the nanowire structures 16. The nanowire structures 16 in this example are oriented in a vertical direction and extend upwardly from the source region 14. In other examples, the nanowire structures may extend in other directions such as a horizontal direction. Also, although nanowires with a circular cross-sectional shape are shown in this example, in other examples the cross-sectional shape may include circular, square, rectangular, triangular, trapezoidal, or other shapes. The example nanowire structure 16, as illustrated in more detail in FIG. 1B, comprises semiconductor material such as silicon that is used to form a channel region between the source region 14 and a drain region 22. The drain region 22 in this example is at the far end section of the nanowire structure 16 opposite the source region 14 and may comprise a metal silicide. Gate oxide 24 is also shown surrounding the nanowire structure 16.

The example semiconductor device 10 further includes insulation material 26 above the substrate 12 and surrounding the nanowire structures 16 and gate material 18. Metal contacts are also included in the semiconductor device 10. In this example, shown are a source contact 28, a gate contact 30 and a drain contact 32.

The number of nanowires needed in a design may be a function of the drive current required for the semiconductor device. By increasing the drive current per nanowire, the number of nanowires required to produce the desired drive current may be reduced.

It has been determined that drive current (I) is equal to total channel charge (nq) multiplied by the average carrier velocity (v) and can be expressed by the following formula: I=nqv. To increase the drive current in the example nanowire devices, band structure engineering can be applied to increase the average carrier velocity through the modulation of the channel electric field.

FIG. 2A depicts an example semiconductor structure 40 that can be implemented using a nanowire. The semiconductor structure 40 comprises a source region 42, a drain region 44, and gate region 46 surrounding a nanowire structure 48. The nanowire structure 48 has a total length Lg and includes a first nanowire section A and a second nanowire section B.

Figure 2B:
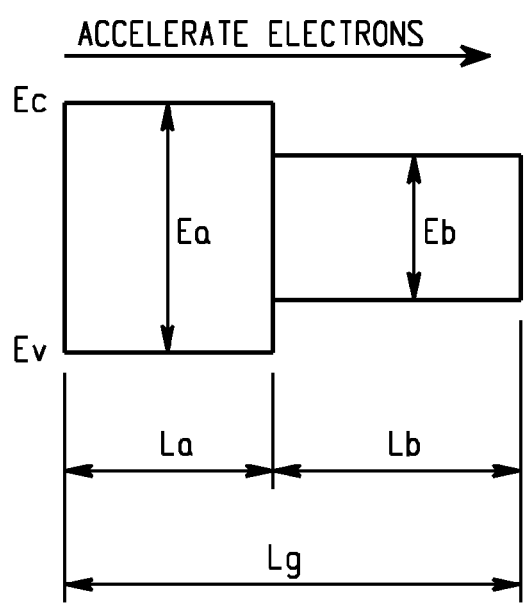
FIG. 2B illustrates the relative levels of the conduction band Ec and valence band Ev for the two nanowire sections A and B of FIG. 2A.

FIG. 2B depicts a drawing illustrating the relative levels of the conduction band $E_c$ and valence band $E_v$ for the two nanowire sections A and B. The first nanowire section A and the second nanowire section B are formed from different materials and as a result have different energy levels. As the figure illustrates, the conduction band $E_c$ level of the first nanowire section A is higher than the conduction band $E_c$ level of the second nanowire section B. Also, as illustrated in the figure, the valence band $E_v$ level of the first nanowire section A is lower than the valence band $E_v$ level of the second nanowire section B. The band gap energy $E_b$ corresponding to section B is smaller than the band gap energy $E_a$ corresponding to section A. The band gap energy differences can cause the flow of electrons from the first nanowire section A to the second nanowire section B to accelerate. The carrier velocity will be enhanced by the band gap induced electric field resulting from the two band gap energy difference.

Figure 3:
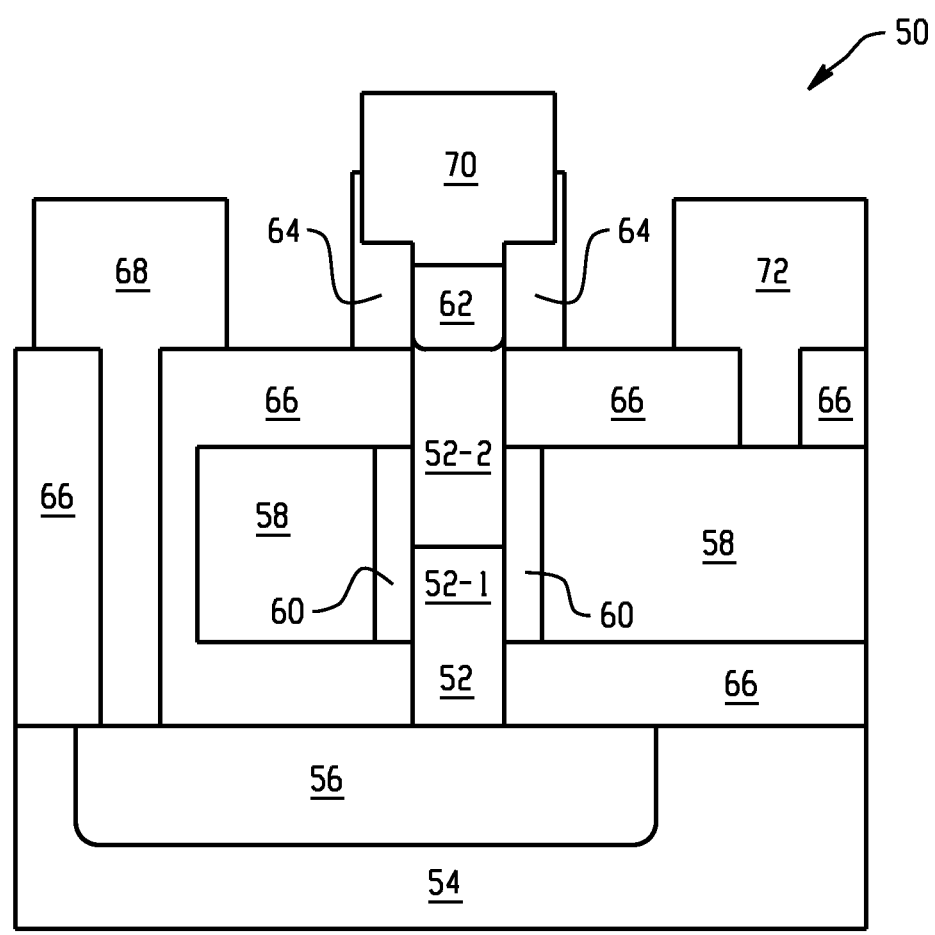
FIG. 3 is a cross sectional view of an example MOSFET semiconductor device that includes a nanowire with multi-level band gap energy, in accordance with some embodiments.

Depicted in FIG. 3 is a cross sectional view of an example MOSFET semiconductor device 50 that includes a nanowire 52 with multi-level band gap energy. The example MOSFET semiconductor device 50 may be fabricated using suitable processes including photolithography, etching, cleaning, chemical mechanical polishing/planarization (CMP), thin film deposition, thermal process (e.g., doping, activation/surface, passivation/material consolidation), epitaxy, and material filling, among others. For example, the photolithography process may include forming a photoresist layer (resist), exposing the resist to a pattern, performing post-exposure bake processes, and developing the resist to form a masking element. The masking element may then be used in an etching process. The etching may be performed using reactive ion etch (RIE) and/or other suitable processes.

The example MOSFET semiconductor device 50 includes a silicon substrate 54 with a doped region 56 which functions as a drain region. The nanowire 52 is formed above the drain region 56 with a first band gap energy portion 52-1 adjacent to the drain region 56 a second band gap energy portion 52-2 on the opposite end of the nanowire 52. Although the nanowire 52 shown in this example has two different band gap energy portions, in other examples the nanowire 52 may have three or more different band gap energy portions with the band gap energy tapering down from portion to portion in the drain to source direction. The bandgap energy may also continuously decrease from the nanowire bottom to the nanowire top instead of decreasing in distinct steps.

The example MOSFET semiconductor device 50 further includes gate material 58 including a Hi-K dielectric 60 surrounding a section of the nanowire 52 at the junction between the first band gap energy portion 52-1 and the second band gap energy portion 52-2. The example MOSFET semiconductor device 50 also includes a source region 62 comprising silicide at the end of the nanowire 52 opposite the drain region 56 and nitride spacers 64 surrounding the source region 62. The MOSFET semiconductor device 50 also includes insulator material 66 and metal contacts. The metal contacts include a drain contact 68, a gate contact 72, and a source contact 70.

Figure 4:
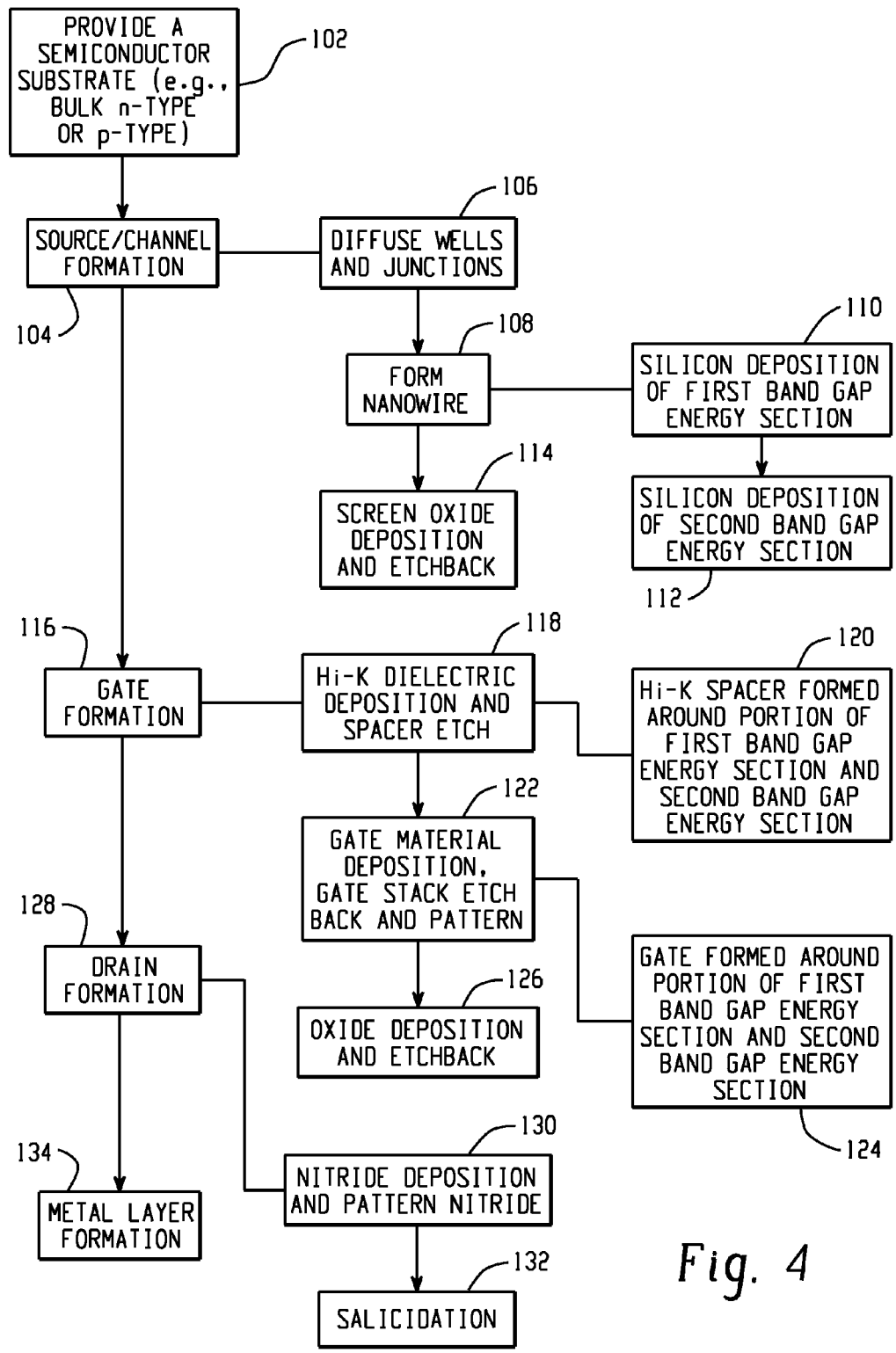
FIG. 4 is a process flow chart depicting an example method for generating a semiconductor device structure having a nanowire with multi-level band gap energy, in accordance with some embodiments.

FIG. 4 is a process flow chart depicting an example method for generating a semiconductor device structure having a nanowire with multi-level band gap energy. This example illustrates a vertical process flow. A semiconductor substrate is provided (operation 102). The substrate may be a bulk substrate such as a bulk n-type or bulk p-type substrate. Other substrates may also be used such as a semiconductor-on-insulator substrate.

Figure 5:
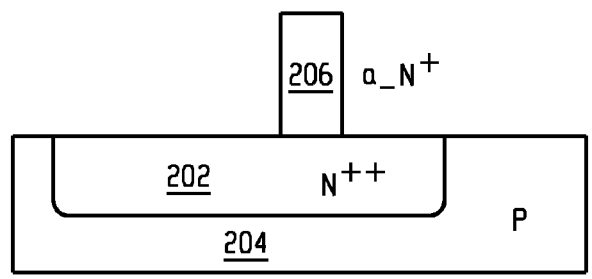
FIGS. 5-12 are drawings depicting example states of a semiconductor structure during fabrication of a semiconductor device structure having a nanowire with multi-level band gap energy, in accordance with some embodiments.

The source and channel regions of the semiconductor device are formed (operation 104). Source formation may involve operations such as well and junction diffusion (operation 106) and N+ and P+ implantation to form a drain region in the semiconductor substrate. The channel region may be fabricated from one or more nanowires (operation 108). In this example, each nanowire has two band gap energy sections, a first band gap energy section and a second band gap energy section. The first band gap energy section is formed first (operation 110), for example, through deposition operations. FIG. 5 depicts a cross sectional view of a portion of a semiconductor device after source 202 formation in the substrate 204 and formation of the first band gap energy section 206 of the nanowire. The first band gap energy section 206 may be formed from a semiconductor material such as silicon or other suitable semiconductor material.

Figure 6:
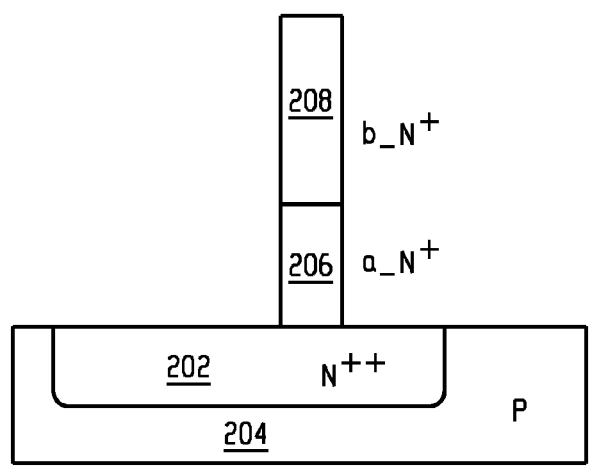

Referring back to FIG. 4, the second band gap energy section of the nanowire is formed (operation 112), for example, using deposition operations. FIG. 6 depicts a cross sectional view of a portion of a semiconductor device after formation of the second band gap energy section 208 of the nanowire. The second band gap energy section 208 may be formed from a semiconductor material such as silicon or other suitable semiconductor material. The material used in the second band gap energy section should be chosen such that it produces a higher band gap energy level than that of the first band gap energy section.

Figure 7:
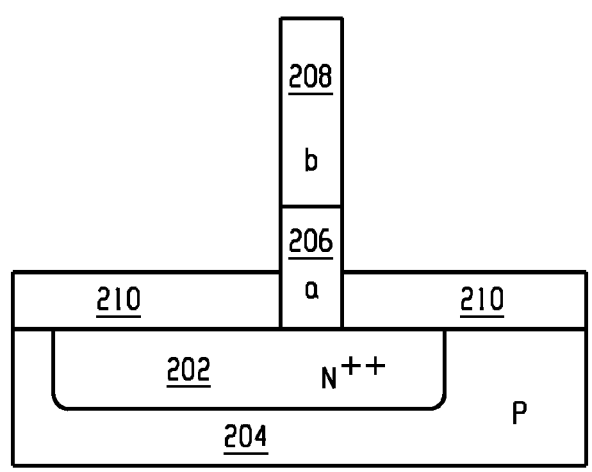

Referring back to FIG. 4, after the second band gap energy section of the nanowire is formed, screen oxide deposition and etch back takes place (operation 114). FIG. 7 depicts a cross sectional view of a portion of a semiconductor device after deposition and etch back of screen oxide 210.

Figure 8:
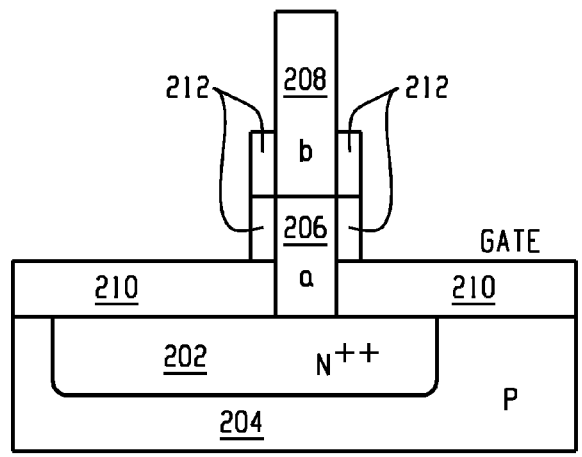

Referring back to FIG. 4, after source and channel formation, gate formation (operation 116) may take place. Gate formation may involve High-K dielectric deposition and patterning (operation 118). This operation may result in a High-K spacer formed around the junction of the first band gap energy section and the second band gap energy section (operation 120). FIG. 8 depicts a cross sectional view of a portion of a semiconductor device after High-K spacer formation around the junction of the first band gap energy section 206 and the second band gap energy section 208.

Figure 9:
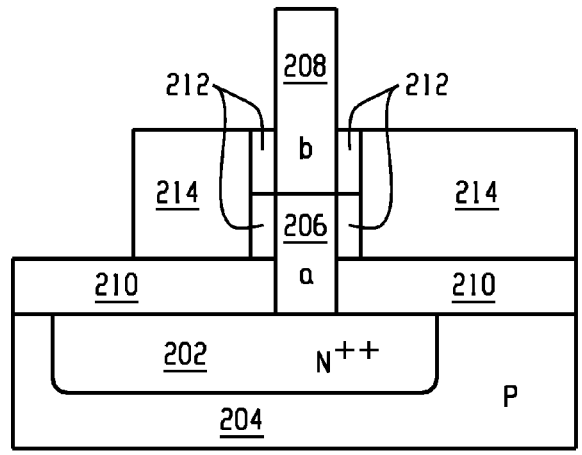

Referring back to FIG. 4, after High-K dielectric deposition and patterning, gate material deposition, gate stack etch back and gate stack patterning takes place (operation 122). This results in a transistor gate being formed around the junction of the first band gap energy section and the second band gap energy section (operation 124). FIG. 9 depicts a cross sectional view of a portion of a semiconductor device after formation of the gate 214.

Figure 10:
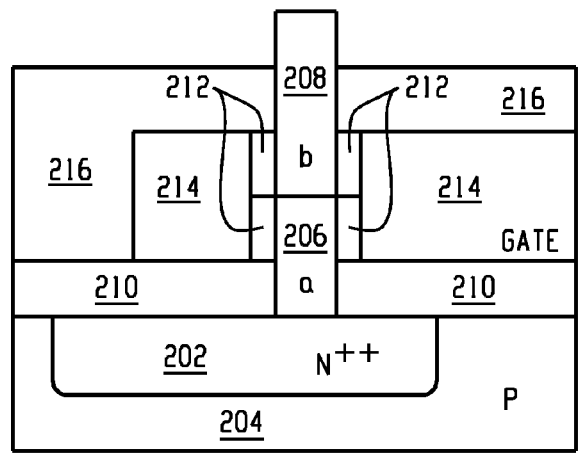

Referring back to FIG. 4, after gate stack patterning, oxide deposition and etch back operations takes place (operation 126). FIG. 10 depicts a cross sectional view of a portion of a semiconductor device after oxide deposition and etch back showing depositing oxide 216.

Figure 11:
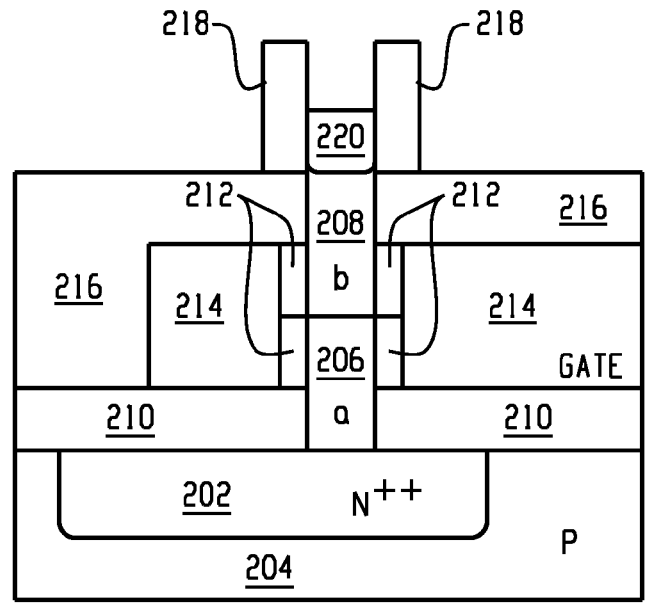

Referring back to FIG. 4, after gate formation and oxide deposition, drain formation may occur (operation 128). Drain formation may involve nitride spacer formation (operation 130). This may involve nitride deposition and patterning operations. FIG. 11 depicts a cross sectional view of a portion of a semiconductor device after nitride patterning and illustrates the deposited nitride spacers 218.

Figure 12:
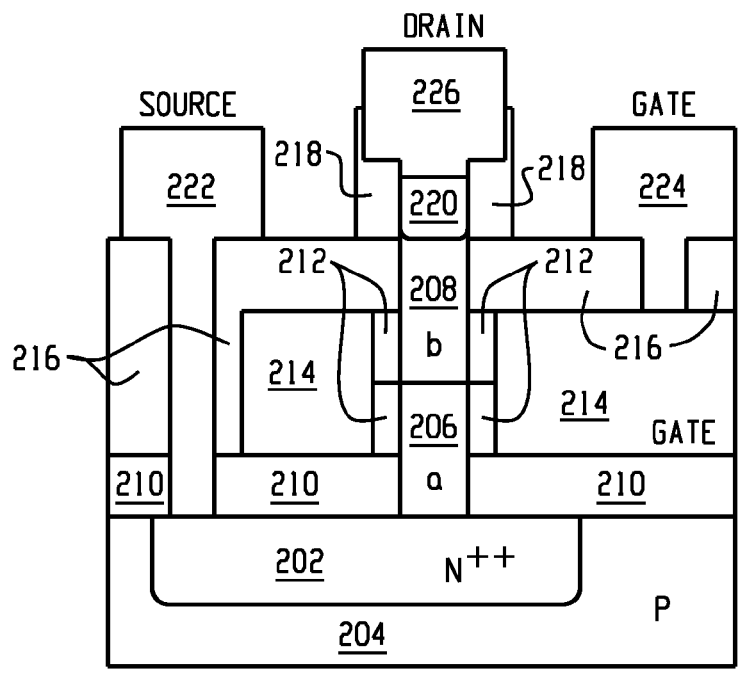

Referring back to FIG. 4, after nitride patterning, salicidation operations take place (operation 132) wherein silicide is formed at the end of the nanowire section opposite the substrate. Finally, metallization operations (operation 134) are shown where metal contacts are added to the drain, source, and gate regions of the transistor device. FIG. 12 depicts a cross sectional view of a portion of a semiconductor device after salicidation and metallization. The figure illustrates silicide 220 formed at the end of the second nanowire section 208 opposite the substrate 204 and metal contacts added to the drain, source, and gate regions of the transistor device. Shown are drain contact 222, gate contact 224, and source contact 226.

In the example transistor formed by the method of FIG. 4 and illustrated in FIG. 12, the band gap energy change from the first band gap energy section 206 to the second band gap energy section 208 should result in a band gap energy of the second band gap energy section 208 being greater than the band gap energy of the first band gap energy section 206. This difference in band gap energy should cause the flow of electrons from the second band gap energy section 208 to the first band gap energy section 206 to accelerate. The carrier velocity should be enhanced by the band gap induced electric field at the band gap energy interface between the two sections. Thus, the drive current for the semiconductor device should be increased without additional supply voltage boost.

In the example transistor, the channel electric field is modulated by band structure engineering through the variation of the nanowire band gap energy. For the two-level band gap energy sections in the example transistor, the channel length for the first band gap energy section 206 is less than or equal to half of the total channel length.

Figure 13:
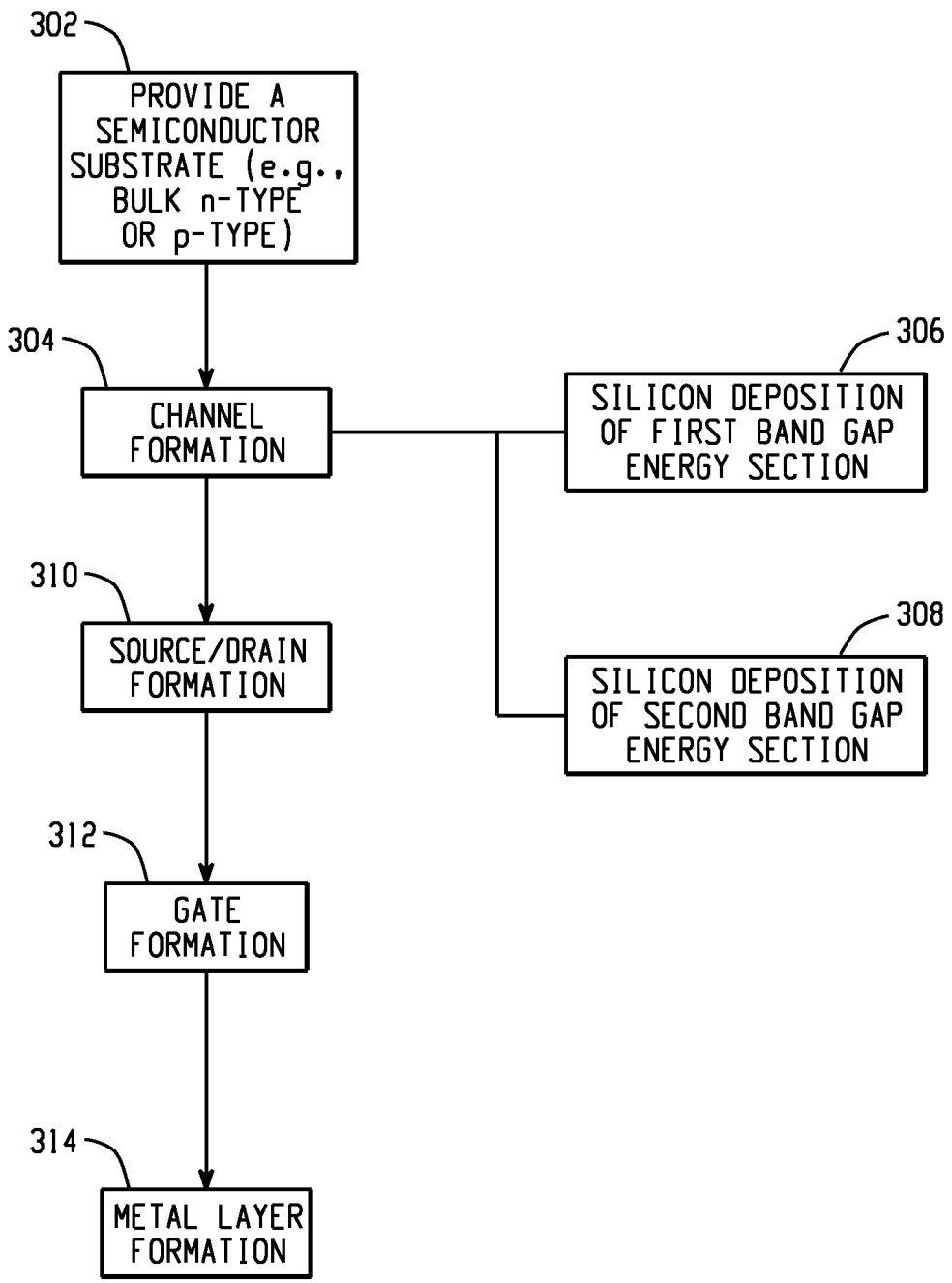
FIG. 13 is a process flow chart depicting another example method for generating a semiconductor device structure having a nanowire with multi-level band gap energy, in accordance with some embodiments.

FIG. 13 is a process flow chart depicting another example method for generating a semiconductor device structure having a nanowire with multi-level band gap energy. This example illustrates a process flow producing horizontally oriented devices. A semiconductor substrate is provided (operation 302). The substrate may be a bulk substrate such as a bulk n-type or bulk p-type substrate. Other substrates may also be used such as a semiconductor-on-insulator substrate. The channel region of the semiconductor device is formed (operation 304). In this example, the channel region is formed by a nanowire with two different types of material, such as silicon and silicon germanium, which create a first band gap energy section and a second band gap energy section (operations 306 and 308). Each band gap energy section is formed, for example, through deposition operations. The source and drain regions are formed (operation 310) as well as nitride spacers.

Figure 14A:
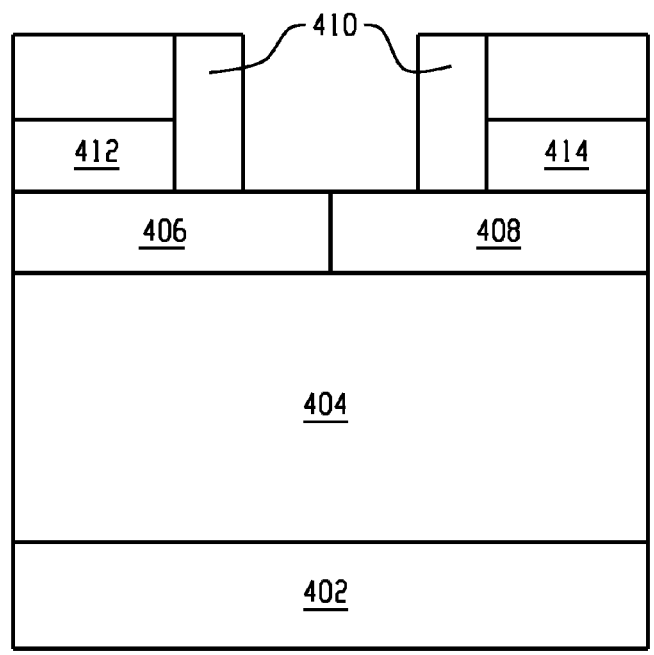
Figure 14B:
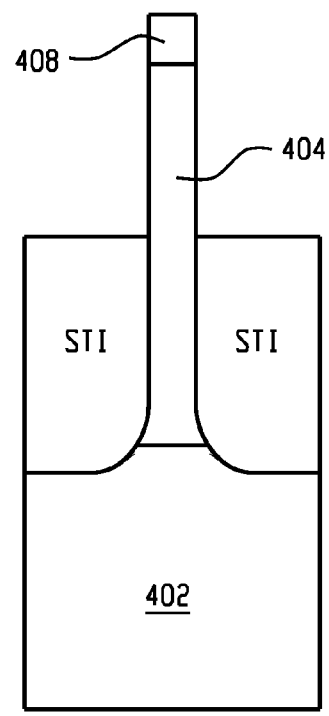

FIG. 14A is a cross sectional view along the channel length of an example semiconductor structure during fabrication. Shown are the silicon substrate 402, silicon germanium 404 above the silicon, a first band gap energy section 406 and a second band gap energy section 408 of the channel, spacers 410, the source region 412 and the drain region 414. FIG. 14B is a cross sectional view along the channel width of the example semiconductor structure of FIG. 14A.

Referring back to FIG. 13, Gate formation (operation 312) takes place and may involve etching operations to clear an area for the gate. Gate formation may involve High-K dielectric deposition and patterning and well as gate material deposition. This may result in a High-K dielectric spacer formed around the junction of the first band gap energy section and the second band gap energy section and gate material formed over the High-K dielectric material.

FIG. 15A is a cross sectional view along the channel length of the example semiconductor structure after gate formation. This figure shows silicon germanium oxide 416 formed on the substrate and gate material 418 formed around the junction of the first band gap energy section 406 and the second band gap energy section 408. FIG. 15B is a cross sectional view along the channel width of the example semiconductor structure of FIG. 15A.

Referring back to FIG. 13, metallization operations (operation 314) may take place during which metal contacts are added to the drain, source, and gate regions of the transistor device.

In the example transistor formed by the method of FIG. 13 and illustrated in FIGS. 15A and 15B, the band gap energy change from the first band gap energy section 406 to the second band gap energy section 408 should result in a band gap energy of the second band gap energy section 408 being greater than the band gap energy of the first band gap energy section 406. This difference in band gap energy should cause the flow of electrons from the second band gap energy section 408 to the first band gap energy section 406 to accelerate. The carrier velocity should be enhanced by the band gap induced electric field at the band gap energy interface between the two sections. Thus, the drive current for the semiconductor device should be increased without additional supply voltage boost.

In the example transistor, the channel electric field is modulated by band structure engineering through the variation of the nanowire band gap energy. For the two-level band gap energy sections in the example transistor, the channel length for the first band gap energy section 406 is less than or equal to half of the total channel length.

Figure 16:
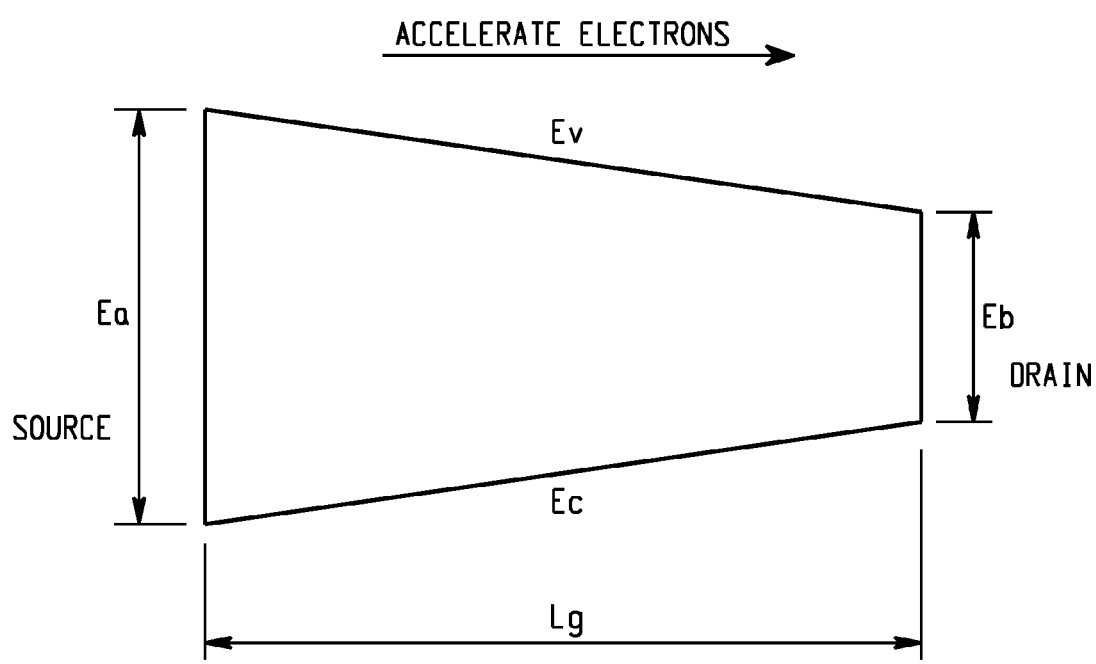
FIG. 16 is a drawing illustrating the relative levels of the conduction band $E_c$ and valence band $E_v$ for a nanowire structure having a continuously varying band gap energy section wherein the bandgap energy is larger in the source side and smaller on the drain side, in accordance with some embodiments.

FIG. 16 is a drawing illustrating the relative levels of the conduction band $E_c$ and valence band $E_v$ for another example nanowire structure. This example nanowire structure has a continuously varying band gap energy section wherein the bandgap energy is larger on the source side and smaller on the drain side. This example nanowire structure may be formed with silicon germanium. The continuously varying band gap energy section may be formed in the nanowire structure by continuously increasing the concentration of germanium in the band gap section in the source to drain direction. This continuously varying nature of the band gap energy in the example nanowire structure should cause the flow of electrons from the source side to the drain side to accelerate. The carrier velocity should be enhanced by the band gap induced electric field caused by the continuously varying nature of the band gap energy. Thus, the drive current for a semiconductor device formed with this example nanowire structure should be increased without additional supply voltage boost.

In accordance with the teachings described herein, semiconductor structures having a channel formed from a nanowire with multi-level band gap energy sections and methods for fabricating the semiconductor devices are provided. In one example, the semiconductor device comprises a nanowire structure formed between a source region and a drain region. The nanowire structure has a first band gap energy section joined with a second band gap energy section. The first band gap energy section is coupled to the source region and has a band gap energy level greater than the band gap energy level of the second band gap energy section. The second band gap energy section is coupled to the drain region. The first band gap energy section comprises a first material and the second band gap energy section comprises a second material wherein the first material is different from the second material. The semiconductor device further comprises a gate region formed around the junction at which the first band gap energy section and the second band gap energy section are joined.

These aspects and other embodiments may include one or more of the following features. The gate region may comprise a High-K dielectric material and metal gate material wherein the High-K dielectric material is formed around the junction at which the first band gap energy section and the second band gap energy section are joined. The nanowire structure may further comprise a third band gap energy section comprising a third material wherein the third material is different from the first material and the second material. The third band gap energy section may be coupled between the second band gap energy section and the drain region. The nanowire structure may extend vertically away from a substrate. The first material may comprise silicon germanium and the second material may comprise silicon germanium. The band gap energy of the second band gap energy section is smaller than the band gap energy of the first band gap energy section. The length of the first band gap energy section may be greater than the length of the second band gap energy section.

In another example, a method of fabricating a semiconductor device is provided. The method comprises forming a nanowire structure between a source region and a drain region. The nanowire structure has a first band gap energy section joined with a second band gap energy section. The first band gap energy section is coupled to the source region and has a band gap energy level greater than the band gap energy level of the second band gap energy section. The second band gap energy section is coupled to the drain region. The first band gap energy section comprises a first material and the second band gap energy section comprises a second material. The first material is different from the second material. The method further comprises forming a gate region around the junction at which the first band gap energy section and the second band gap energy section are joined.

These aspects and other embodiments may include one or more of the following features. The gate region may comprise a High-K dielectric material and metal gate material wherein the High-K dielectric material is formed around the junction at which the first band gap energy section and the second band gap energy section are joined. The nanowire structure may further comprise a third band gap energy section comprising a third material wherein the third material is different from the first material and the second material. The third band gap energy section may be coupled between the second band gap energy section and the drain region. The nanowire structure may extend vertically away from a substrate. The first material may comprise silicon germanium and the second material may comprise silicon germanium. The band gap energy of the first band gap energy section may be greater than the band gap energy of the second band gap energy section. The length of the first band gap energy section may be greater than the length of the second band gap energy section.

In yet another example, a nanowire structure for use as a channel in a semiconductor device is provided. The nanowire structure comprises a first band gap energy section joined with a second band gap energy section. The first band gap energy section is coupled to a source region in the semiconductor device and has a band gap energy level greater than the band gap energy level of the second band gap energy section. The second band gap energy section is coupled to a drain region in the semiconductor device. The first band gap energy section comprises a first material. The second band gap energy section comprises a second material. The first material is different from the second material. A gate region in the semiconductor device is formed around the junction at which the first band gap energy section and the second band gap energy section are joined.

These aspects and other embodiments may include one or more of the following features. The gate region may comprise a High-K dielectric material and metal gate material wherein the High-K dielectric material is formed around the junction at which the first band gap energy section and the second band gap energy section are joined. The nanowire structure may further comprise a third band gap energy section comprising a third material wherein the third material is different from the first material and the second material. The third band gap energy section may be coupled between the second band gap energy section and the drain region. The nanowire structure may extend vertically away from a substrate. The first material may comprise silicon germanium and the second material may comprise silicon germanium. The band gap energy of the second band gap energy section is smaller than the band gap energy of the first band gap energy section. The length of the first band gap energy section may be greater than the length of the second band gap energy section.

In an additional example, a nanowire structure for use as a channel in a semiconductor device is provided. The semiconductor device comprises a nanowire structure having a source side adjacent to a source region of the semiconductor device and a drain side adjacent to a drain region in the semiconductor structure. The nanowire structure has a continuously varying band gap energy section wherein the bandgap energy is larger on the source side and smaller on the drain side. The continuously varying band gap energy section has an increasing concentration of germanium in the source to drain direction. The semiconductor device further comprises a gate region formed around a central region of the continuously varying band gap energy section.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a nanowire structure formed between a source region and a drain region, the nanowire structure having a first band gap energy section joined with a second band gap energy section, the first band gap energy section being joined to the source region and having a band gap energy level greater than the band gap energy level of the second band gap energy section, the second band gap energy section being joined to the drain region, the first band gap energy section being composed of a single first material, and the second band gap energy section being composed of a single second material that (i) has a lower conduction band level than does the first band gap energy section and (ii) has a higher valence band than does the first band gap energy section;
a junction at which the first band gap energy section is joined to the first band gap energy section, such that
the first band gap energy section has a first length extending from the source region to the junction,
the second band gap energy section has a second length extending from the drain region to the junction, and
the first length is greater than the second length; and
a gate region formed around the junction.

2. The semiconductor device of claim 1, wherein the gate region comprises High-K dielectric material and metal gate material and wherein the High-K dielectric material is formed around the junction at which the first band gap energy section and the second band gap energy section are joined.

3. The semiconductor device of claim 1, wherein the nanowire structure extends vertically away from a substrate.

4. The semiconductor device of claim 1, wherein the first material comprises silicon germanium and the second material comprises silicon germanium.

5. The semiconductor device of claim 1, wherein the first material consists of silicon without germanium and the second material consists of silicon with germanium.

6. The semiconductor device of claim 1, wherein the nanowire structure projects horizontally along a substrate.

7. A nanowire structure for use as a channel in a semiconductor device, the nanowire structure comprising:
a first band gap energy section joined to a second band gap energy section at a junction, the first band gap energy section being joined to a source region in the semiconductor device and having a band gap energy level greater than the band gap energy level of the second band gap energy section, the second band gap energy section being joined to a drain region in the semiconductor device;
wherein:
the first band gap energy section is composed of a single first material,
the second band gap energy section is composed of a single second material that (i) has a lower conduction band level than does the first band gap energy section and (ii) has a higher valence band than does the first band gap energy section;
the first band gap energy section has a first length extending from the source region to the junction,
the second band gap energy section has a second length extending from the drain region to the junction,
the first length is greater than a second length, and
a gate region in the semiconductor device is formed around the junction at which the first band gap energy section and the second band gap energy section are joined.

8. The nanowire structure of claim 7, wherein the gate region comprises High-K dielectric material and metal gate material and wherein the High-K dielectric material is formed around the junction at which the first band gap energy section and the second band gap energy section are joined.

9. The nanowire structure of claim 7, wherein the first material comprises silicon germanium and the second material comprises silicon germanium.

10. The nanowire structure of claim 7, wherein the first material consists of silicon without germanium and the second material consists of silicon with germanium.

11. The nanowire structure of claim 7, wherein the nanowire structure extends horizontally along a substrate.

12. A semiconductor device comprising:
source and drain regions; and
a nanowire structure between the source and drain regions and having first and second band gap energy sections, wherein:
the first band gap energy section is composed of a single first material,
the second band gap energy section is composed of a single second material,
the first and second band gap energy sections are joined to each other at a junction,
the first and second band gap energy sections are respectively joined to the source and the drain, such that the first band gap energy section has a first length extending from the source region to the junction, and the second band gap energy section has a second length extending from the drain region to the junction, and
the second length is less than the first length.

13. The semiconductor device of claim 12, wherein the first and second band gap energy sections of the nanowire structure include different materials.

14. The semiconductor device of claim 12, further comprising a gate region formed around the first and second band gap energy sections of the nanowire structure.

15. The semiconductor device of claim 12, wherein the first band gap energy section of the nanowire structure has a band gap energy greater than a band gap energy of the second band gap energy section of the nanowire structure.

16. The semiconductor device of claim 12, further comprising a substrate, wherein the nanowire structure extends substantially vertically relative to the substrate.

17. The semiconductor device of claim 12, further comprising a substrate. wherein the nanowire structure extends substantially horizontally relative to the substrate.

* * * * *